United States Patent
Arayashiki et al.

(10) Patent No.: US 9,530,823 B2
(45) Date of Patent: Dec. 27, 2016

(54) MEMORY DEVICE AND METHOD FOR MANUFACTURING THE SAME

(71) Applicant: Kabushiki Kaisha Toshiba, Minato-ku (JP)

(72) Inventors: Yusuke Arayashiki, Mie-ken (JP); Kensuke Takahashi, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/168,089

(22) Filed: Jan. 30, 2014

(65) Prior Publication Data

US 2015/0069314 A1    Mar. 12, 2015

Related U.S. Application Data

(60) Provisional application No. 61/876,998, filed on Sep. 12, 2013.

(51) Int. Cl.
*H01L 27/24*  (2006.01)
*H01L 45/00*  (2006.01)

(52) U.S. Cl.
CPC ......... *H01L 27/2481* (2013.01); *H01L 45/085* (2013.01); *H01L 45/1233* (2013.01); *H01L 45/1266* (2013.01); *H01L 45/145* (2013.01); *H01L 45/146* (2013.01); *H01L 45/148* (2013.01); *H01L 45/1675* (2013.01)

(58) Field of Classification Search
CPC ...... H01L 45/08; H01L 45/14; H01L 45/1608; H01L 45/1633
USPC .......................................................... 257/2
See application file for complete search history.

(56) References Cited

U.S. PATENT DOCUMENTS

| | | | |
|---|---|---|---|
| 8,206,995 B2 | 6/2012 | Reyes et al. | |
| 2008/0062740 A1* | 3/2008 | Baek et al. | 365/148 |
| 2010/0187493 A1* | 7/2010 | Takahashi | 257/4 |
| 2011/0031466 A1 | 2/2011 | Kagawa et al. | |
| 2011/0121254 A1 | 5/2011 | Dressler et al. | |

FOREIGN PATENT DOCUMENTS

| | | |
|---|---|---|
| JP | 2006-319263 | 11/2006 |
| JP | 2007-157941 | 6/2007 |

* cited by examiner

*Primary Examiner* — Tran Tran
(74) *Attorney, Agent, or Firm* — Oblon, McClelland, Maier & Neustadt, L.L.P.

(57) ABSTRACT

A memory device according to an embodiment includes an ion metal layer containing a first metal, an opposing electrode, a resistance change layer disposed between the ion metal layer and the opposing electrode, a first layer disposed in a central portion of a space between the ion metal layer and the resistance change layer, and a second layer disposed in an end portion of the space. The first layer contains a second metal. The second layer contains the second metal, and at least one selected from oxygen and nitrogen.

13 Claims, 10 Drawing Sheets

MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 61/876,998, filed on Sep. 12, 2013; the entire contents of which are incorporated herein by reference.

FIELD

Embodiments described herein relate generally to a memory device and a method for manufacturing the same.

BACKGROUND

In recent years, a memory device has been proposed in which a high-resistance film is provided between a metal film and an opposing electrode and the electrical resistance value of the high-resistance film is changed by causing ions of the metal included in the metal film to diffuse inside the high-resistance film to cause filaments to form or disappear. In such a memory device, it is necessary to shrink the structure to increase the bit density. However, it is a problem that the characteristics become unstable when the structure is shrunk.

DETAILED DESCRIPTION

A memory device according to an embodiment includes an ion metal layer containing a first metal, an opposing electrode, a resistance change layer disposed between the ion metal layer and the opposing electrode, a first layer disposed in a central portion of a space between the ion metal layer and the resistance change layer, and a second layer disposed in an end portion of the space. The first layer contains a second metal. The second layer contains the second metal, and at least one selected from oxygen and nitrogen.

A method for manufacturing a memory device includes stacking an opposing electrode, a resistance change layer, a metal layer, and an ion metal layer, the metal layer containing a second metal, the ion metal layer containing a first metal. The method includes patterning the metal layer to form a first patterned surface. And, the method includes oxidizing or nitriding the first patterned surface of the metal layer.

Embodiments of the invention will now be described with reference to the drawings.

First Embodiment

First, a first embodiment will be described.

Figure 1:
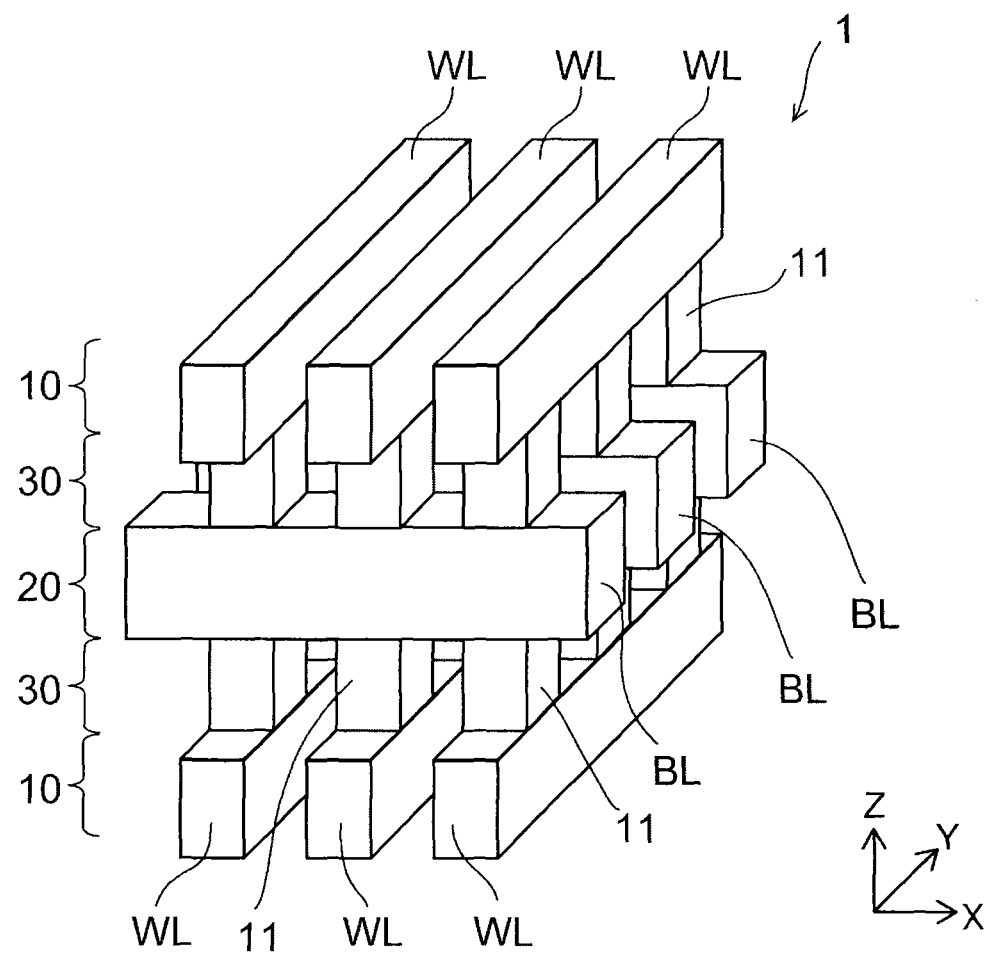
FIG. 1 is a perspective view showing a memory device according to a first embodiment.

FIG. 1 is a perspective view showing a memory device according to the embodiment.

Figure 2:
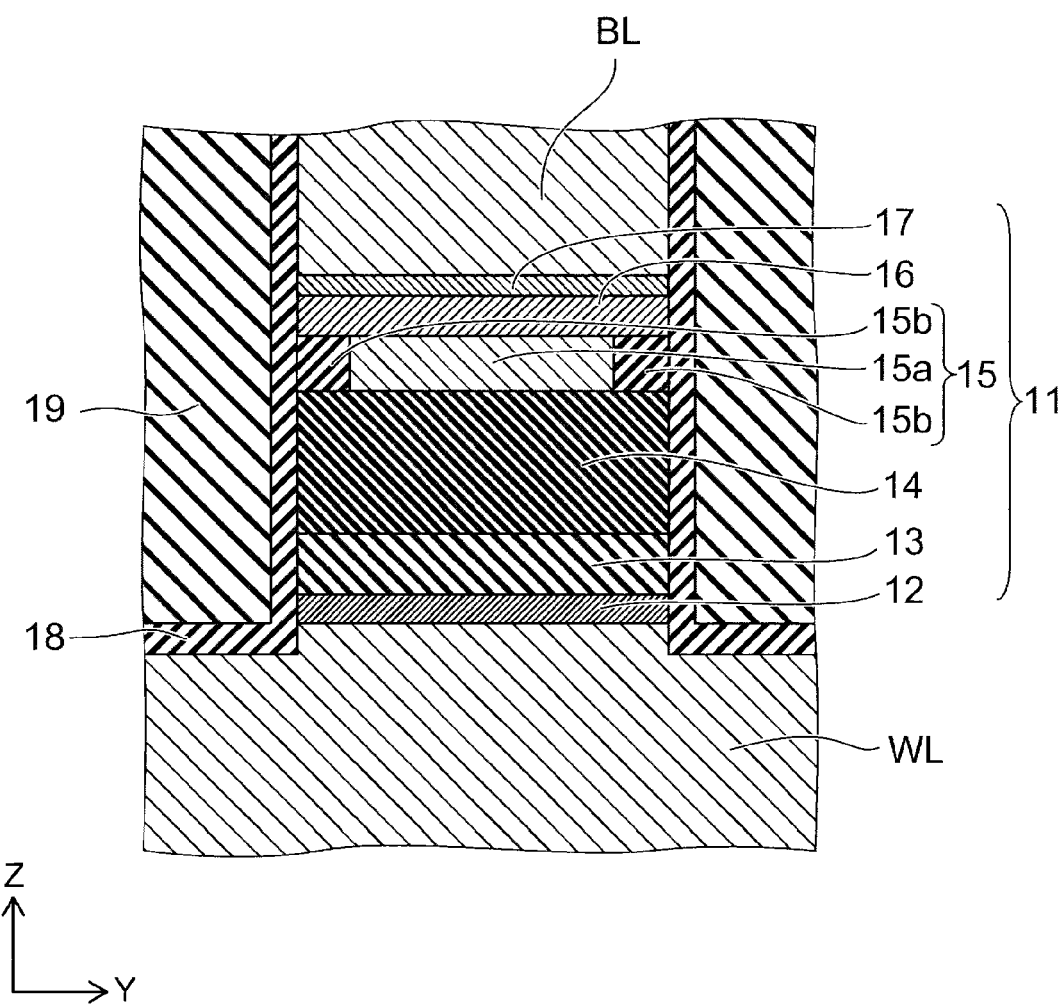
FIG. 2 is a cross-sectional view showing a region around a pillar of the memory device according to the first embodiment.

FIG. 2 is a cross-sectional view showing a region around a pillar of the memory device according to the embodiment.

The memory device according to the embodiment is a Conduction bridge RAM (CBRAM) which is one type of resistance random access memory device (ReRAM).

As shown in FIG. 1, a word line interconnect layer 10 and a bit line interconnect layer 20 are stacked alternately along a vertical direction (a Z-direction) in the memory device 1 according to the embodiment. A memory cell layer 30 is provided between the word line interconnect layer 10 and the bit line interconnect layer 20. Although only two layers of the word line interconnect layer 10 and one layer of the bit line interconnect layer 20 are shown in FIG. 1, this is not limited thereto; and more word line interconnect layers 10 and bit line interconnect layers 20 may be stacked alternately.

Multiple word lines WL that extend in one direction (a Y-direction) are provided in each of the word line interconnect layers 10. Multiple bit lines BL that extend in one other direction (an X-direction) are provided in each of the bit line interconnect layers 20. The X-direction, the Y-direction, and the Z-direction intersect each other, e.g., are orthogonal to each other. In each of the memory cell layers 30, pillars 11 that extend in the Z-direction are provided between the word lines WL and the bit lines BL. In other words, in each of the memory cell layers 30, the multiple pillars 11 are arranged in a matrix configuration along the X-direction and the Y-direction. Also, an inter-layer insulating film 19 (referring to FIG. 2) is disposed between the word lines WL, between the bit lines BL, and between the pillars 11. However, the inter-layer insulating film 19 is not shown for convenience of illustration in FIG. 1.

In each of the pillars 11 as shown in FIG. 2, a barrier metal layer 12, a lower layer electrode layer (a current-limiting layer) 13, a resistance change layer 14, an intermediate layer 15, an ion metal layer 16, and a barrier metal layer 17 are stacked in this order from the word line WL toward the bit line BL. Also, a liner film 18 is provided on the side surface of the pillar 11; and the inter-layer insulating film 19 is provided around the liner film 18.

The intermediate layer 15 is disposed in the space between the resistance change layer 14 and the ion metal layer 16. Further, in the intermediate layer 15, when viewed in the Z-direction, the central portion is used as a metal layer 15a that is conductive; and the peripheral portion is used as an insulating layer 15b that is insulative. In other words, when viewed in the Z-direction, the insulating layer 15b is disposed around the metal layer 15a to surround the metal layer 15a.

Although the ion metal layer 16 is disposed to be higher than the resistance change layer 14 because the pillar 11 shown in FIG. 2 is a pillar 11 for which the word line WL is disposed below and the bit line BL is disposed above, the ion metal layer 16 is disposed to be lower than the resistance change layer 14 in the case of a pillar 11 for which the bit line BL is disposed below and the word line WL is disposed above. In other words, inside each of the pillars 11, the ion metal layer 16 is disposed to be relatively on the bit line BL side; and the resistance change layer 14 is disposed to be relatively on the word line WL side. The word line WL functions as an opposing electrode. Unlike FIG. 2, inside each of the pillars 11, the ion metal layer 16 may be disposed to be relatively on the word line WL side; and the resistance change layer 14 may be disposed to be relatively on the bit line BL side.

An example of the materials of the components will now be described. The word line WL and the bit line BL are formed of, for example, tungsten (W). The barrier metal layers 12 and 17 are formed of, for example, titanium nitride (TiN), tantalum nitride (TaN), or tungsten nitride (WN). The liner film 18 is formed of, for example, silicon nitride ($Si_3N_4$); and the inter-layer insulating film 19 is formed of, for example, silicon oxide ($SiO_2$).

The ion metal layer 16 is a layer for forming a filament by supplying a metal to the resistance change layer 14 and contains a first metal. The first metal is ionized easily and is a metal that is able to move repeatedly through the resistance change layer 14. The first metal is, for example, silver (Ag). Also, the metal to be ionized is not limited to silver and may be copper, etc.

The metal layer 15a contains a second metal. The second metal is a metal that is oxidized or nitrided more easily than the first metal. The second metal is, for example, titanium (Ti). However, the second metal is not limited to titanium and may be, for example, at least one type of metal selected from the group consisting of titanium, niobium (Nb), hafnium (Hf), aluminum (Al), tantalum (Ta), tungsten (W), molybdenum (Mo), cobalt (Co), nickel (Ni), copper (Cu), ruthenium (Ru), and lanthanum (La). The insulating layer 15b contains at least one selected from the second metal described above, oxygen (O), and nitrogen (N).

The resistance change layer 14 is a layer in which a filament is formed of the metal that moves from the ion metal layer 16. The first metal described above is diffusible in the resistance change layer 14; and the resistance change layer 14 is formed of a material having a resistivity that is higher than that of the first metal or a material that is insulative, e.g., silicon oxide ($SiO_2$). However, the material of the resistance change layer 14 is not limited to silicon oxide. The material of the resistance change layer 14 may include, for example, a material including silicon such as amorphous silicon (a-Si), polysilicon (poly-Si), silicon oxide ($SiO_2$), silicon nitride ($Si_3N_4$), silicon oxynitride (SiON), etc., a transition metal oxide such as hafnium oxide ($HfO_x$), hafnium silicon oxide ($HfSiO_x$), hafnium silicon oxynitride (HfSiON), aluminum oxide ($AlO_x$), hafnium aluminum oxide ($HfAlO_x$) and zirconium oxide ($ZrO_x$), etc. The resistance change layer 14 is not limited to a single-layer structure and may be a stacked structure film having two layers or more. For example, a stack of different types of materials including silicon or a stack of a transition metal oxide and a material including silicon may be used.

The lower layer electrode layer 13 is formed of a material in which the first metal described above is diffusible. The lower layer electrode layer 13 is a current-limiting layer for preventing short defects due to overcurrent in the set operation of the memory cell and is a layer having a resistance value that is about within the operation voltage range of the memory device 1. The resistance value that is necessary for the lower layer electrode layer 13 is determined by the design of the memory device 1, but is about 1 MΩ to 1 GΩ. For example, the lower layer electrode layer 13 may be a layer that is formed of amorphous silicon or polysilicon for which the thickness is adjusted to have the desired resistance value, or may be a layer that is formed of tantalum aluminum nitride (TaAlN) or tantalum silicon nitride (TaSiN) for which the thickness or composition is adjusted to have the desired resistance value. According to the design of the memory device 1, the lower layer electrode layer 13 may be omitted. In the embodiment, the lower layer electrode layer 13 is formed of, for example, polysilicon.

A method for manufacturing the memory device according to the embodiment will now be described.

FIG. 3 to FIG. 11 are perspective cross-sectional views showing the method for manufacturing the memory device according to the embodiment.

Figure 3:
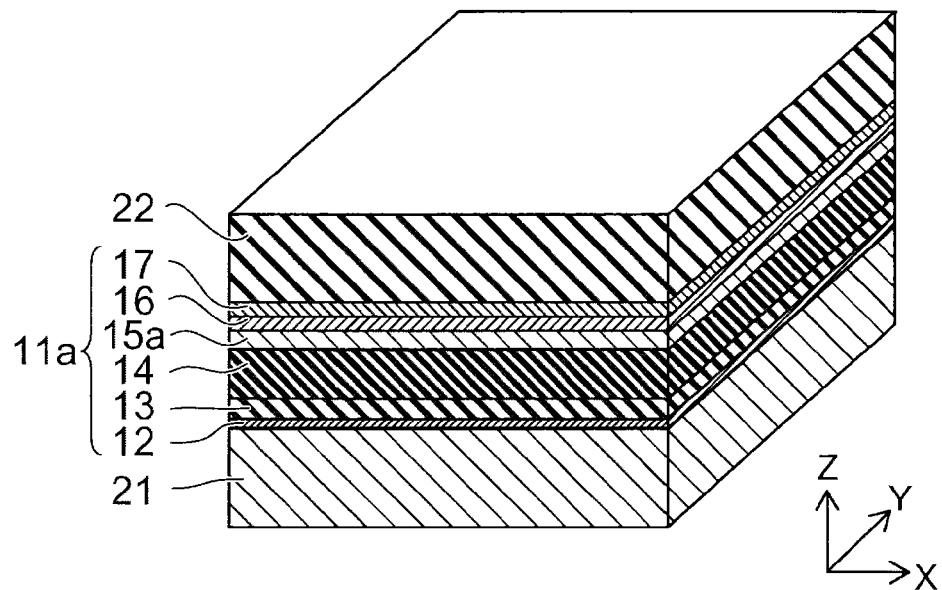
FIG. 3 to FIG. 11 are perspective cross-sectional views showing a method for manufacturing the memory device according to the first embodiment.

First, as shown in FIG. 3, an inter-layer insulating film (not shown) is formed on a silicon substrate (not shown); and a conductive film 21 is formed on the entire surface by depositing, for example, tungsten on the inter-layer insulating film. Then, a stacked film 11a is formed on the entire surface of the conductive film 21 by stacking the barrier metal layer 12, the lower layer electrode layer 13, the resistance change layer 14, the metal layer 15a, the ion metal layer 16, and the barrier metal layer 17 in this order. Then, a hard mask 22 is formed on the stacked film 11a. The hard mask 22 is formed of, for example, silicon oxide or silicon nitride.

Figure 4:
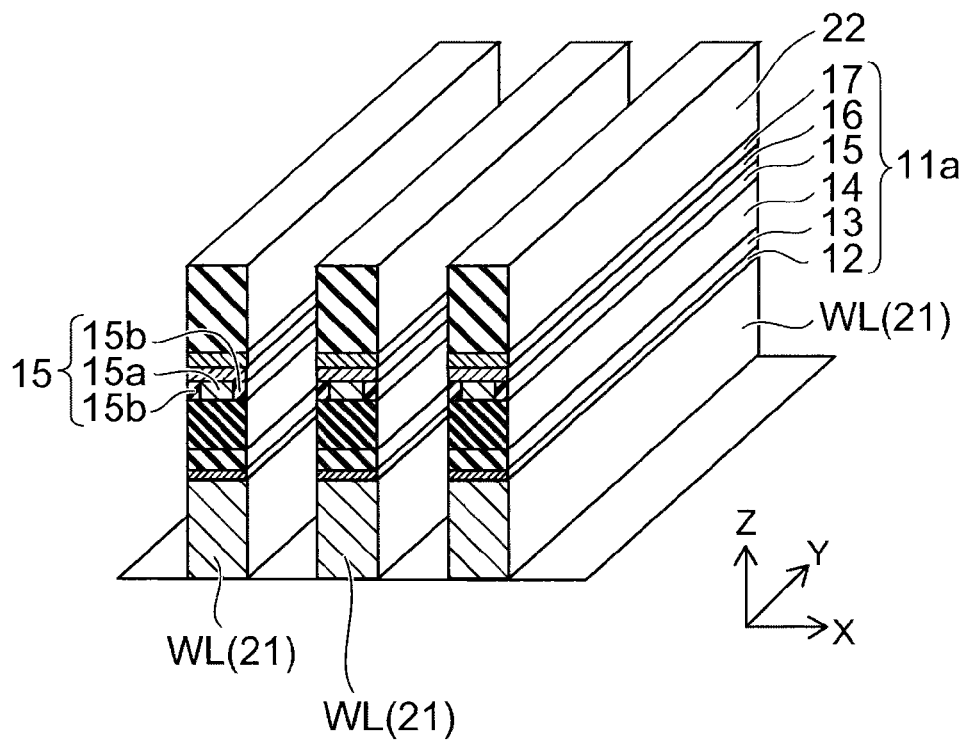

Then, as shown in FIG. 4, the hard mask 22 is patterned into a line-and-space configuration extending in the Y-direction by lithography. Then, the stacked film 11a and the conductive film 21 are patterned by performing anisotropic etching such as RIE (reactive ion etching), etc., using the hard mask 22 as a mask. Thereby, the stacked film 11a is patterned into a line configuration extending in the Y-direction. Also, the conductive film 21 is patterned into a line configuration extending in the Y-direction to become the multiple word lines WL. At this time, the patterned surfaces, i.e., the side surfaces on the two X-direction facing sides, of the resistance change layer 14 are damaged.

Then, the side surfaces of the stacked film 11a are oxidized by performing oxidation treatment. For example, the oxidation treatment is a low-temperature thermal oxidation treatment in which heating is performed in an oxidation atmosphere to a temperature, e.g., a temperature of not more than 400° C., such that the silver inside the ion metal layer 16 does not migrate outside the ion metal layer 16. Thereby, the second metal, e.g., titanium, which is oxidized more easily than silver, is preferentially oxidized at the vicinity of the patterned surfaces, i.e., the side surfaces on the two X-direction facing sides, of the metal layer 15a. As a result, both of the X-direction end portions of the metal layer 15a change into the insulating layer 15b that includes titanium oxide by being oxidized. Nitriding may be performed instead of the oxidation treatment. In such a case, the insulating layer 15b includes titanium nitride. Further, both oxidation treatment and nitriding may be performed. In such a case, the insulating layer 15b includes titanium oxynitride. The insulating layer 15b becomes thicker than the metal layer 15a due to the volume expansion due to the oxidizing or the nitriding. The metal layer 15a and the insulating layer 15b are generally referred to as the intermediate layer 15.

At this time, the ion metal layer 16 remains as-is substantially without being oxidized or nitrided because the first metal (e.g., silver) is oxidized and nitrided less easily than the second metal (e.g., titanium).

Figure 5:
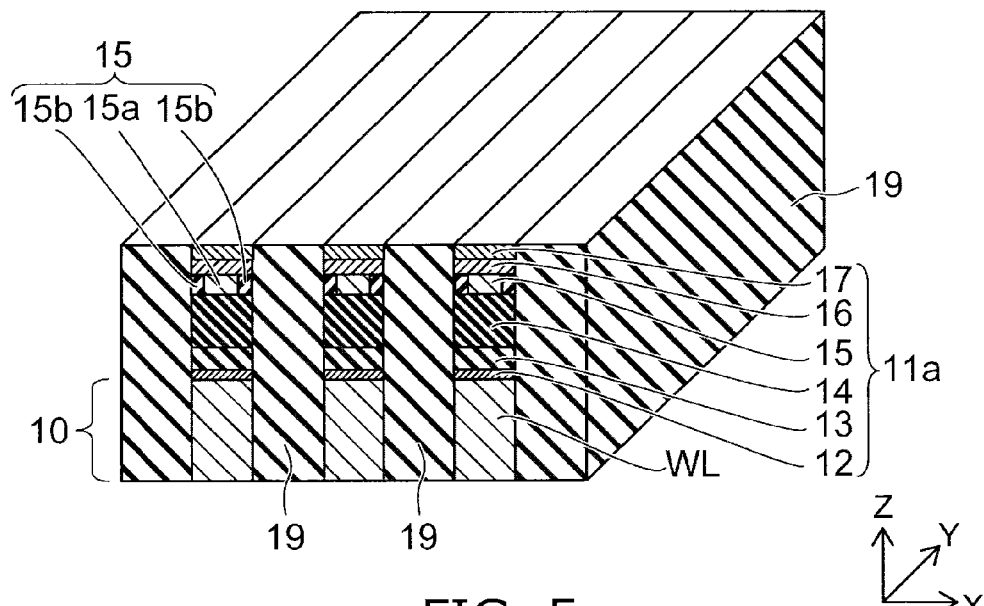

Then, as shown in FIG. 5, silicon oxide is deposited after forming the liner film 18 (referring to FIG. 2) on the entire surface. Then, CMP (chemical mechanical polishing) is performed using the barrier metal layer 17 as a stopper. Thereby, the hard mask 22 is removed; and the inter-layer insulating film 19 is filled between the stacked film 11a patterned into the line configuration. As a result, the word line interconnect layer 10 in which the word lines WL and the inter-layer insulating film 19 are arranged alternately, and a structural body in which the inter-layer insulating film 19 and the stacked film 11a having the line configuration are arranged alternately, are formed.

Figure 6:
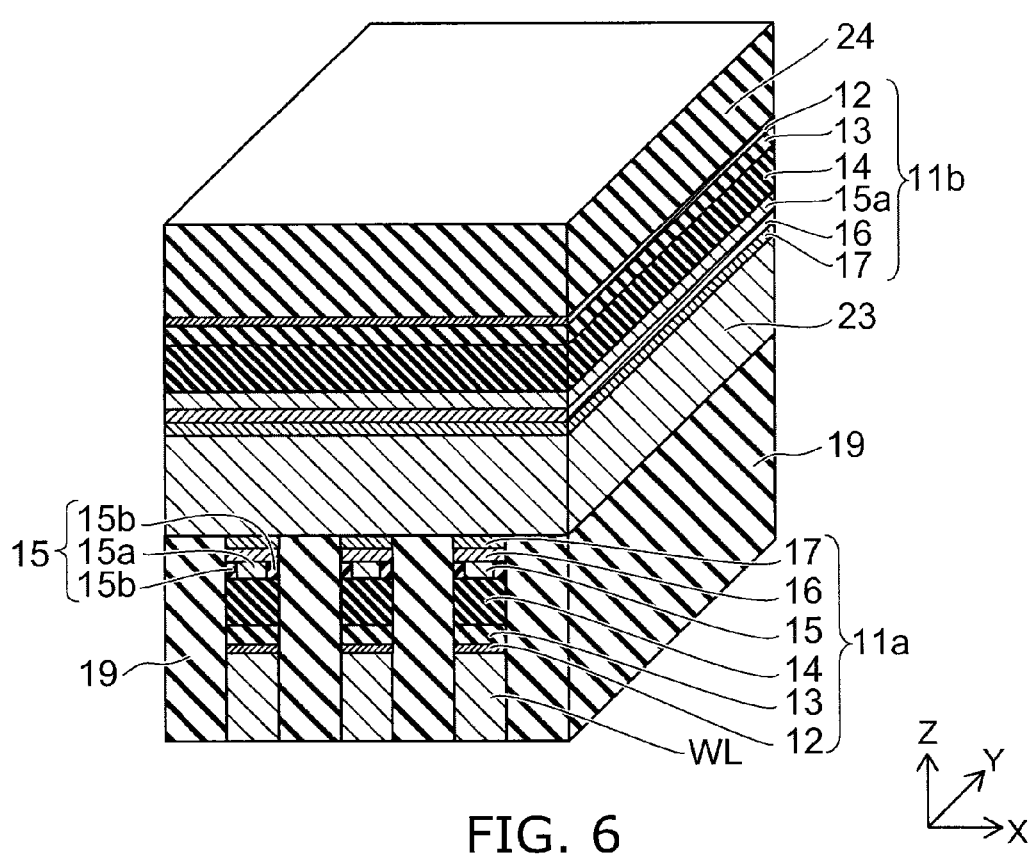

Then, as shown in FIG. 6, a conductive film 23 is formed on the entire surface by depositing, for example, tungsten. Then, a stacked film 11b is formed by stacking the barrier metal layer 17, the ion metal layer 16, the metal layer 15a, the resistance change layer 14, the lower layer electrode layer 13, and the barrier metal layer 12 in this order. Then, a hard mask 24 is formed.

Figure 7:
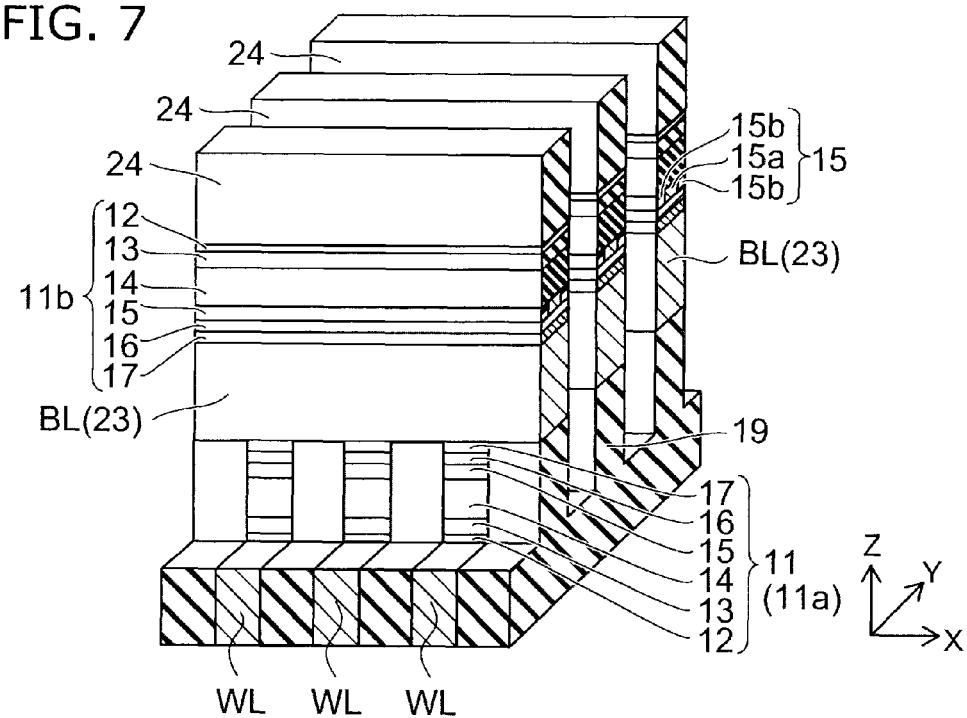

Then, as shown in FIG. 7, the hard mask 24 is patterned into a line-and-space configuration extending in the X-direction by lithography. Then, the stacked film 11b, the conductive film 23, and the stacked film 11a are patterned by performing anisotropic etching such as RIE, etc., using the hard mask 24 as a mask.

Thereby, the stacked film 11b is patterned into a line configuration extending in the X-direction. Also, the conductive film 23 is patterned into a line configuration extending in the X-direction to become the multiple bit lines BL. Further, the stacked film 11a that is already patterned into the line configuration extending in the Y-direction is divided in the Y-direction. Thereby, the stacked film 11a is divided along both the X-direction and the Y-direction to be patterned into the multiple pillars 11 arranged in a matrix configuration. At this time, the patterned surfaces, i.e., the side surfaces on the two Y-direction facing sides, of the resistance change layers 14 that are included in the stacked film 11b and the pillars 11 are damaged.

Then, the side surfaces of the pillars 11 and the stacked film 11b are oxidized by performing oxidation treatment. The oxidation treatment is a low-temperature thermal oxidation treatment at a temperature of, for example, not more than 400° C. Thereby, titanium, which is oxidized more easily than silver, is preferentially oxidized at the vicinity of the patterned surfaces, i.e., the side surfaces on the two Y-direction facing sides, of the metal layer 15a. Thereby, the side surfaces on the two Y-direction facing sides of the metal layer 15a become the insulating layer 15b by being oxidized. At this time, in the metal layer 15a included in the pillar 11, the insulating layer 15b is formed in the entire peripheral portion to be provided around the metal layer 15a that remains in the central portion. Nitriding may be performed instead of the oxidation treatment or in addition to the oxidation treatment.

Figure 8:
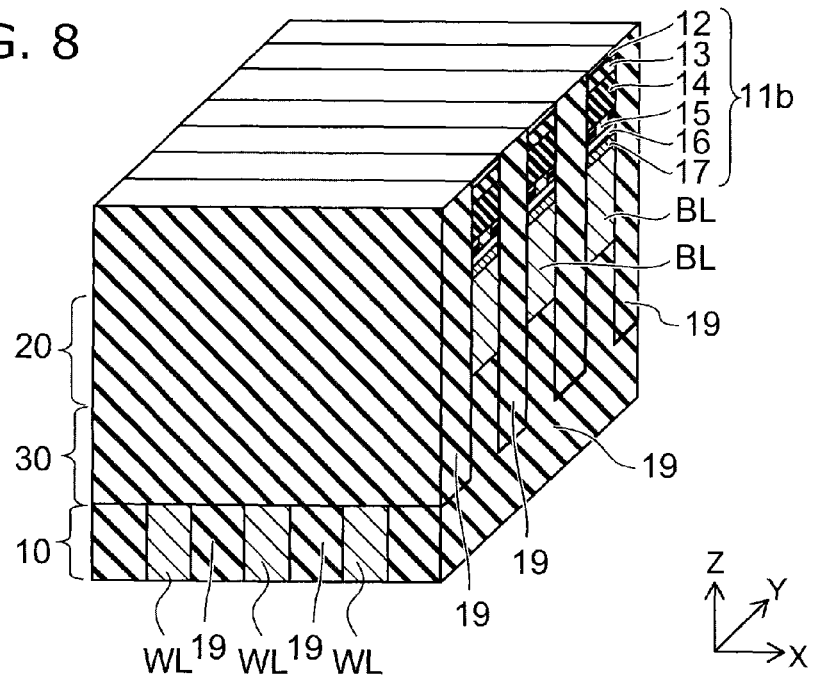

Then, as shown in FIG. 8, silicon oxide is deposited after forming the liner film 18 (referring to FIG. 2) on the entire surface. Then, CMP is performed using the barrier metal layer 12 of the stacked film 11b as a stopper. Thereby, the hard mask 24 is removed; and the inter-layer insulating film 19 is filled between the pillars 11 and between the stacked film 11b patterned into the line configuration. As a result, the memory cell layer 30 in which the pillars 11 are arranged in a matrix configuration inside the inter-layer insulating film 19, the bit line interconnect layer 20 in which the bit lines BL and the inter-layer insulating film 19 are arranged alternately, and a structural body in which the inter-layer insulating film 19 and the stacked film 11b patterned into the line configuration are arranged alternately, are formed.

Figure 9:
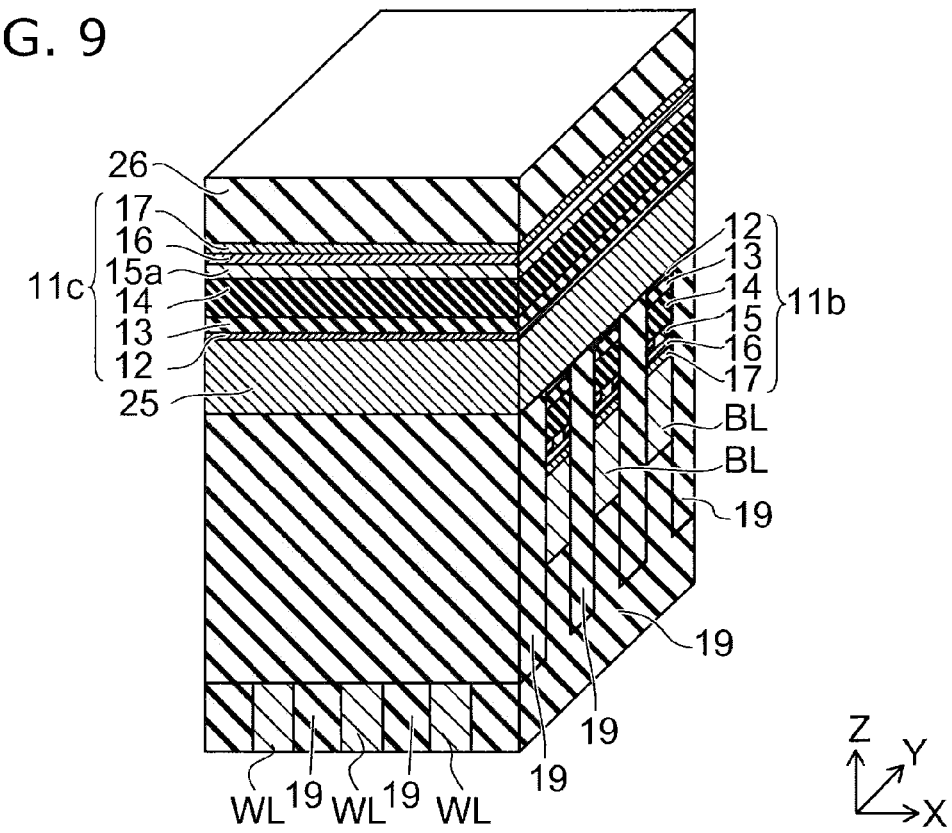

Then, as shown in FIG. 9, a conductive film 25 is formed by depositing, for example, tungsten on the entire surface. Then, a stacked film 11c is formed on the entire surface by stacking the barrier metal layer 12, the lower layer electrode layer 13, the resistance change layer 14, the metal layer 15a, the ion metal layer 16, and the barrier metal layer 17 in this order. Then, a hard mask 26 is formed.

Figure 10:
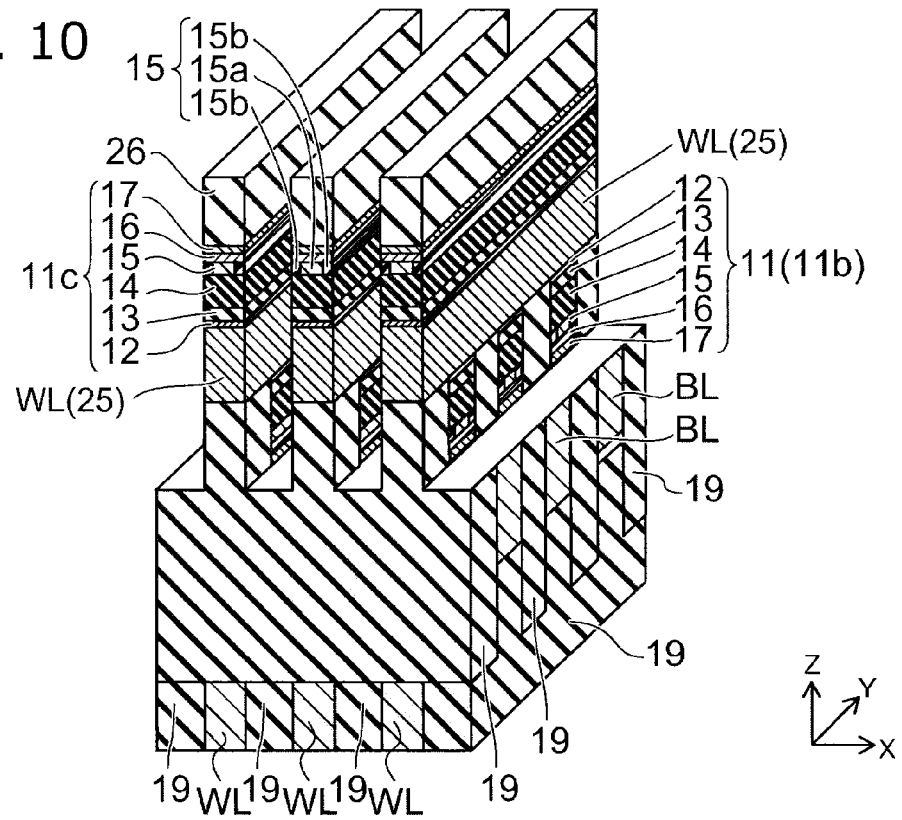

Then, as shown in FIG. 10, the hard mask 26 is patterned into a line-and-space configuration extending in the Y-direction by lithography. Then, the stacked film 11c, the conductive film 25, and the stacked film 11b are patterned by performing anisotropic etching such as RIE, etc., using the hard mask 26 as a mask.

Thereby, the stacked film 11c is patterned into a line configuration extending in the Y-direction. Also, the conductive film 25 is patterned into a line configuration extending in the Y-direction to become the multiple word lines WL. Further, the stacked film 11b that is already patterned into the line configuration extending in the X-direction is divided in the X-direction. Thereby, the stacked film 11b is divided along both the X-direction and the Y-direction to be patterned into the multiple pillars 11 arranged in a matrix configuration. At this time, the patterned surfaces, i.e., the side surfaces on the two X-direction facing sides, of the resistance change layers 14 that are included in the stacked film 11c and the pillars 11 are damaged.

Then, the side surfaces of the stacked film 11c and the pillars 11 patterned from the stacked film 11b are oxidized by performing oxidation treatment. Titanium, which is oxidized more easily than silver, is preferentially oxidized at the vicinity of the patterned surfaces, i.e., the side surfaces on the two X-direction facing sides, of the metal layers 15a included in the pillars 11 and the stacked film 11c to become the insulating layer 15b. Nitriding may be performed instead of the oxidation treatment or in addition to the oxidation treatment.

Figure 11:
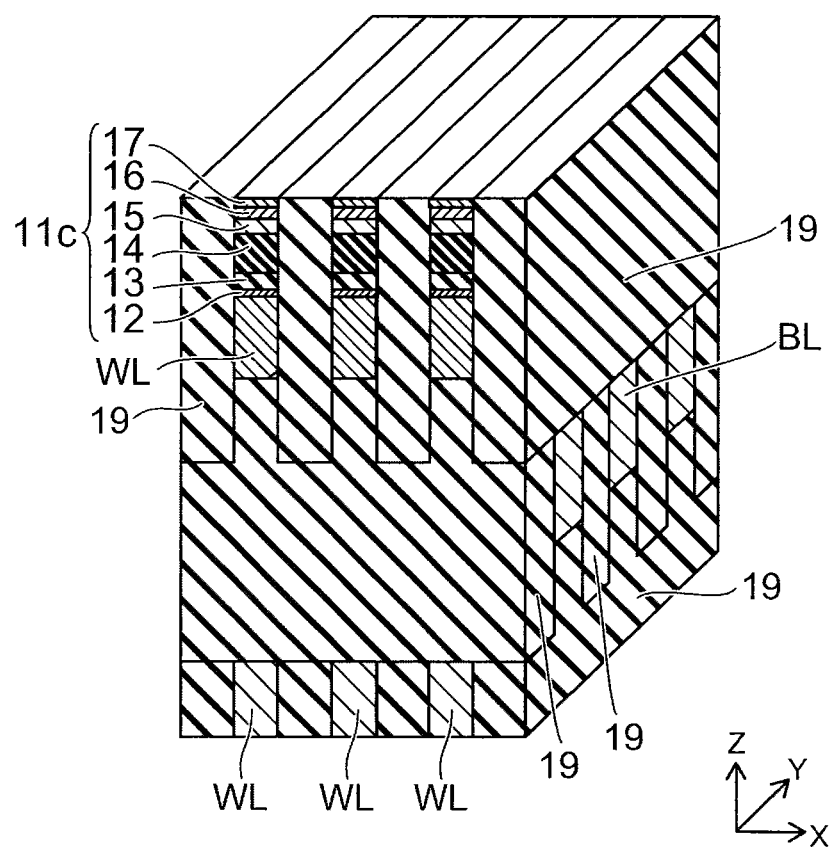

Then, as shown in FIG. 11, silicon oxide is deposited after forming the liner film 18 (referring to FIG. 2) on the entire surface. Then, CMP is performed using the barrier metal layer 17 of the uppermost layer as a stopper. Thereby, the hard mask 26 is removed; and the inter-layer insulating film 19 is filled between the pillars 11 and between the stacked film 11c patterned into the line configuration.

Thereafter, similarly, the process of forming a conductive film and a stacked film on the entire surface of the stacked film that includes the resistance change layer 14, the metal layer 15a, and the ion metal layer 16 and is patterned into the line configuration extending in the one direction and the process of patterning the stacked film of the upper layer, the conductive film, and the stacked film of the lower layer into a line configuration extending in one other direction are repeated. Thereby, the word lines WL that extend in the Y-direction, the pillars 11, the bit lines BL that extend in the X-direction, and the pillars 11 can be formed repeatedly; and the memory device 1 can be manufactured.

Operations and effects of the memory device according to the embodiment will now be described.

Figure 12:
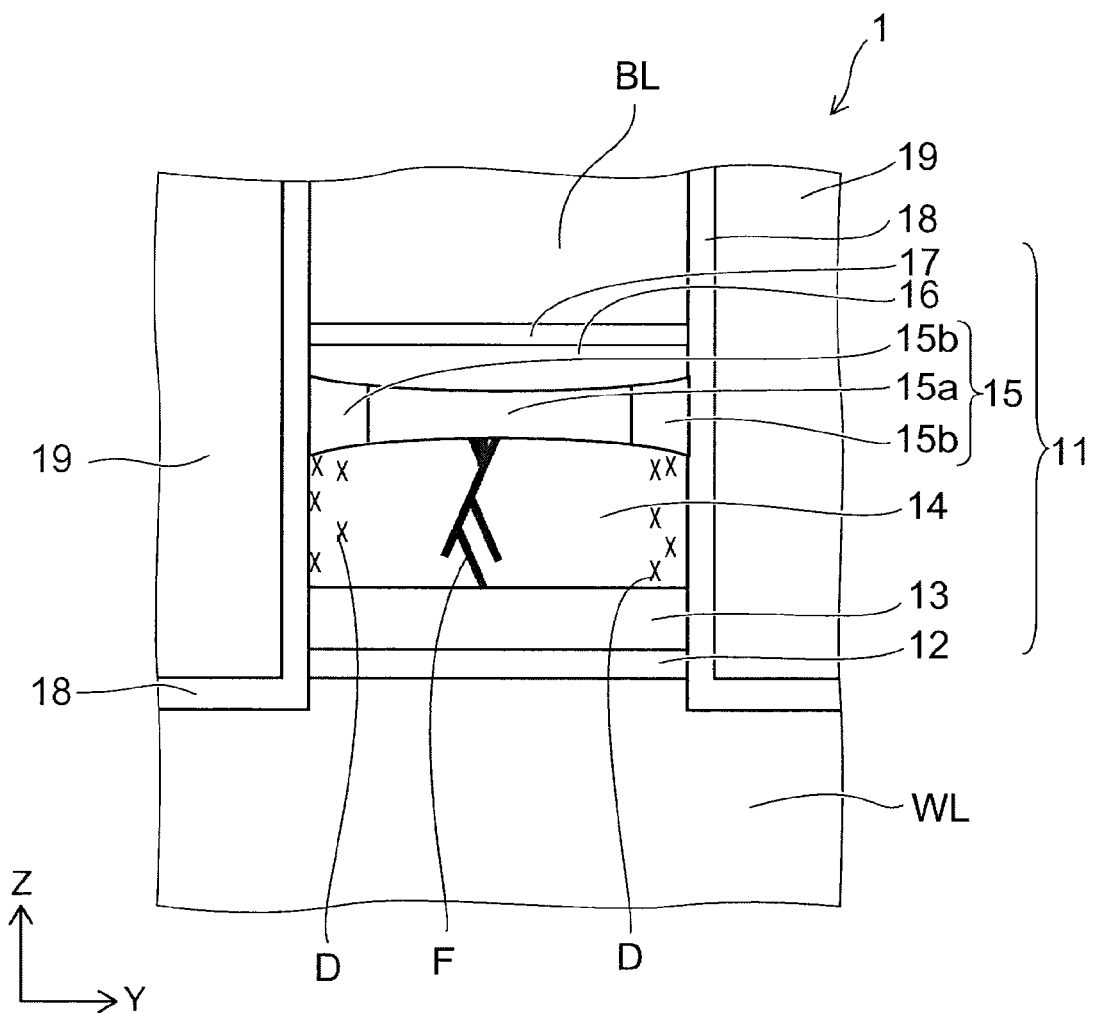
FIG. 12 is a schematic cross-sectional view showing an operation of the memory device according to the first embodiment.

FIG. 12 is a schematic cross-sectional view showing an operation of the memory device according to the embodiment.

First, the basic memory operation will be described.

As shown in FIG. 12, when a positive voltage that causes the word line WL to be negative and the bit line BL to be positive is applied to the pillar 11, a portion of the silver atoms included in the ion metal layer 16 ionizes to become positive ions. Then, the positive ions move toward the word line WL which is negative, pass through the metal layer 15a, and enter the resistance change layer 14. Then, these bond with the electrons supplied from the word line WL inside the resistance change layer 14 and precipitate as silver atoms. Thereby, a filament F made of mainly silver is formed inside the resistance change layer 14 to pierce these layers. As a result, the filament F becomes a current path; and the pillar 11 is switched to the "low resistance state." This operation is called "setting."

On the other hand, when a reverse voltage that causes the word line WL to be positive and the bit line BL to be negative is applied to the pillar 11, the silver that forms the filament F is ionized to become positive ions that move toward the bit line BL. Then, these bond with electrons supplied from the bit line BL inside the ion metal layer 16 and again become silver atoms. Thereby, at least a portion of the filament F formed inside the resistance change layer 14 disappears; and the pillar 11 is switched to the "high resistance state." This operation is called "resetting."

Effects of providing the intermediate layer 15 that is made of the metal layer 15a and the insulating layer 15b will now be described.

In the memory device 1 according to the embodiment as shown in FIG. 12, damage D is introduced to the peripheral portion of the resistance change layer 14 when patterning the resistance change layer 14 in the manufacturing processes of the memory device 1. Therefore, the film quality of the peripheral portion of the resistance change layer 14 degrades. Then, in the case where the filament F is formed in the peripheral portion, the switching characteristics described above become unstable.

Therefore, in the embodiment, the intermediate layer 15 is provided between the resistance change layer 14 and the ion metal layer 16; the central portion of the intermediate layer 15 is used as the metal layer 15a; and the peripheral portion of the intermediate layer 15 is used as the insulating layer 15b. Thereby, the current can be directed to the central portion of the pillar 11; and the current no longer flows easily in the peripheral portion of the pillar 11. As a result, the filament F is formed easily in the central portion of the resistance change layer 14 where there is little of the damage D; and the switching characteristics of the pillar 11 stabilize.

According to the oxidizing conditions, there are cases where the physical film thickness of the peripheral portion of the intermediate layer 15 increases due to the second metal, e.g., titanium, being oxidized. In such a case, the insulating layer 15b becomes thicker than the metal layer 15a.

Although an example is shown in FIG. 12 in which the thickness of the ion metal layer 16 is about the same as or thinner than that of the metal layer 15a, the ion metal layer 16 may be thicker than the metal layer 15a.

Second Embodiment

A second embodiment will now be described.

Figure 13:
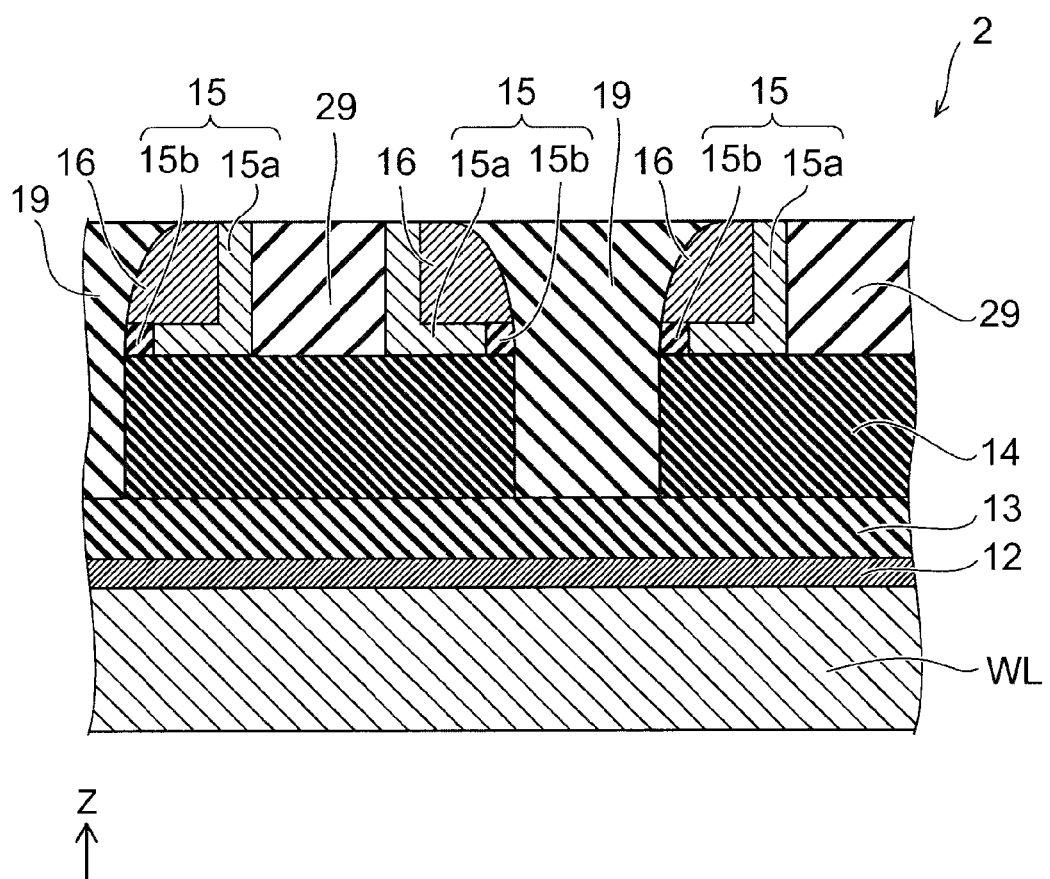
FIG. 13 is a cross-sectional view showing a memory device according to a second embodiment.

FIG. 13 is a cross-sectional view showing a memory device according to the embodiment.

The memory device according to the embodiment also is a CBRAM and is formed by a sidewall process.

As shown in FIG. 13, a word line interconnect layer in which an inter-layer insulating film (not shown) and the word lines WL extending in the Y-direction are arranged alternately is provided in the memory device 2 according to the embodiment. The barrier metal layer 12 and the lower layer electrode layer 13 are stacked in this order on the entire surface of the word line interconnect layer.

The resistance change layers 14 that have band configurations extending in the X-direction are provided to be separated from each other on the lower layer electrode layer 13. A core member 29 that extends in the X-direction is provided on the width-direction central portion of each of the resistance change layers 14. The core member 29 is formed of, for example, an insulating material such as silicon nitride, etc. The intermediate layer 15 is provided on the two width-direction end portions of each of the resistance change layers 14 on the two side surfaces of the core member 29. The intermediate layer 15 extends in the X-direction along the core member 29. As viewed in the X-direction, the cross-sectional configuration of the intermediate layer 15 has an L-shaped configuration along the side surface of the core member 29 and the upper surface of the resistance change layer 14. The end portion of the intermediate layer 15 on the side distal to the core member 29 is used as the insulating layer 15b; and the portion of the intermediate layer 15 other than the insulating layer 15b is used as the metal layer 15a.

Further, the ion metal layer 16 that extends in the X-direction is provided on the intermediate layer 15 to have two surfaces covered with the intermediate layer 15. The ion metal layer 16 also is used as the bit line. Then, the inter-layer insulating film 19 is filled between the stacked bodies that are made of the resistance change layer 14, the core member 29, the intermediate layer 15, and the ion metal layer 16 on the lower layer electrode layer 13.

A method for manufacturing the memory device 2 according to the embodiment will now be described.

As shown in FIG. 13, first, a word line interconnect layer in which the inter-layer insulating film (not shown) and the word lines WL extending in the Y-direction are arranged alternately is formed; and the barrier metal layer 12, the lower layer electrode layer 13, and the resistance change layer 14 are stacked on the word line interconnect layer in this order. Then, the core member 29 is formed in a line-and-space configuration extending in the X-direction on the resistance change layer 14 by lithography. Then, the width of the core member 29 is reduced by slimming.

Then, the metal layer 15a is formed on the entire surface; and subsequently, the ion metal layer 16 is formed on the entire surface. Then, etch-back of the ion metal layer 16, the metal layer 15a, and the resistance change layer 14 is performed to leave the metal layer 15a and the ion metal layer 16 only on the side surface of the core member 29 and to remove the portion of the resistance change layer 14 that is not covered with the core member 29, the intermediate layer 15, and the ion metal layer 16. Thereby, the metal layer 15a, the ion metal layer 16, and the resistance change layer 14 are patterned into a line configuration extending in the X-direction. At this time, the damage D due to the etching is introduced to the end portion of the resistance change layer 14. This damage causes the switching characteristics of the memory cell to degrade.

Then, oxidation treatment is performed. Thereby, the portions of the metal layer 15a that are not covered with the core member 29 and the ion metal layer 16, i.e., the upper end portion and the end portion on the side distal to the core member 29, become the insulating layer 15b by being oxidized. Nitriding may be performed instead of the oxidation treatment. Then, the inter-layer insulating film 19 is deposited on the entire surface; and the upper surface is planarized. Thereby, the upper surface of the ion metal layer 16 is exposed; and the insulating layer 15b that was formed in the upper end portion of the intermediate layer 15 is removed. Thereby, the memory device 2 is manufactured.

According to the embodiment, by providing the metal layer 15a and the insulating layer 15b in the space between the resistance change layer 14 and the ion metal layer 16, the current flowing through the resistance change layer 14 can be directed to the metal layer 15a side; and the formation of the filament in the end portion of the resistance change layer 14 that is damaged by the etching can be suppressed.

Thereby, fluctuation of the switching characteristics of the memory cell is suppressed; and it is possible to stabilize the switching characteristics.

Further, by using a sidewall process in the embodiment, the arrangement period of the ion metal layer 16 that is used as the bit line can be shorter. Thereby, even higher integration of the memory device can be realized.

Otherwise, the configuration, the manufacturing method, and the effects of the embodiment are similar to those of the first embodiment described above.

Third Embodiment

A third embodiment will now be described.

Figure 14:
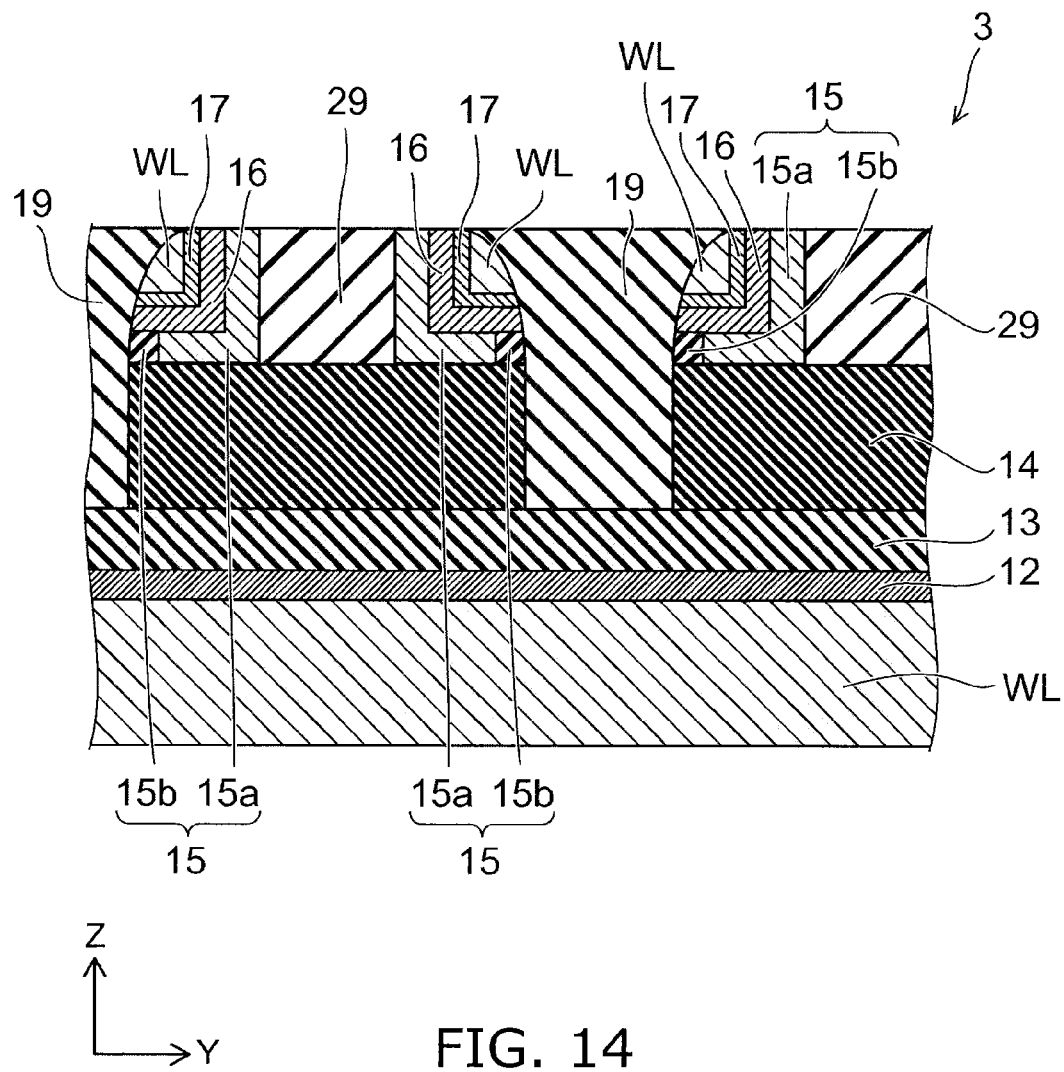
FIG. 14 is a cross-sectional view showing a memory device according to a third embodiment.

FIG. 14 is a cross-sectional view showing a memory device according to the embodiment.

As shown in FIG. 14, compared to the memory device 2 (referring to FIG. 13) according to the second embodiment described above, the memory device 3 according to the embodiment is different in that, in addition to the ion metal layer 16, a word line WL that is made of, for example, tungsten is provided; and the barrier metal layer 17 is provided between the ion metal layer 16 and the word line WL. Otherwise, the configuration, the manufacturing method, and the effects of the embodiment are similar to those of the second embodiment described above.

Although the cross-sectional region of the word line WL is shown as being small for convenience of illustration in FIG. 14, the cross-sectional region may be larger. For example, the cross-sectional area of the word line WL in the YZ plane may be greater than the cross-sectional area of the ion metal layer 16.

According to the embodiments described above, a memory device and a method for manufacturing the memory device for which the characteristics are stable can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device, comprising:
an ion metal layer containing a first metal;
an electrode;
a resistance change layer disposed between the ion metal layer and the electrode;
a first layer disposed in a central portion of a space between the ion metal layer and the resistance change layer, the first layer containing a second metal;
a second layer disposed in an end portion of the space, the second layer containing the second metal, and at least one selected from oxygen and nitrogen; and
a stacked body including the resistance change layer, the first layer, the second layer, and the ion metal layer, outer side surfaces of each of the resistance change layer, the second layer, and the ion metal layer of the stacked body being aligned along an entire length of the outer side surfaces, and
the end portion being a peripheral portion provided around the central portion.

2. The memory device according to claim 1, wherein the end portion is disposed on one side of the space in a width direction of the space.

3. The memory device according to claim 1, wherein the first metal is silver.

4. The memory device according to claim 1, wherein the second metal has a property of oxidizing more easily than the first metal.

5. The memory device according to claim 1, wherein the second metal has a property of nitriding more easily than the first metal.

6. The memory device according to claim 1, wherein the second metal is at least one type of metal selected from the group consisting of titanium, niobium, hafnium, aluminum, tantalum, tungsten, molybdenum, cobalt, nickel, copper, ruthenium, and lanthanum.

7. The memory device according to claim 1, wherein the second layer is insulative.

8. A memory device, comprising:
an ion metal layer containing a first metal;
an electrode;
a resistance change layer disposed between the ion metal layer and the electrode;
a first layer disposed in a central portion of a space between the ion metal layer and the resistance change layer, the first layer containing a second metal;
a second layer disposed in an end portion of the space, the second layer containing the second metal, and at least one selected from oxygen and nitrogen;
a stacked body including the resistance change layer, the first layer, the second layer, and the ion metal layer; and
a liner film directly contacting outer side surfaces of each of the resistance change layer, the second layer, and the ion metal layer; and
the end portion being a peripheral portion provided around the central portion.

9. The memory device according to claim 8, wherein the stacked body has a line configuration, and
the end portion is disposed on one side of the space in a width direction of the space.

10. The memory device according to claim 8, wherein the first metal is silver.

11. The memory device according to claim 8, wherein the second metal has a property of oxidizing more easily than the first metal.

12. The memory device according to claim 8, wherein the second metal has a property of nitriding more easily than the first metal.

13. The memory device according to claim 8, wherein the second metal is at least one type of metal selected from the group consisting of titanium, niobium, hafnium, aluminum, tantalum, tungsten, molybdenum, cobalt, nickel, copper, ruthenium, and lanthanum.

* * * * *